(12) United States Patent
Sasajima et al.

(10) Patent No.: US 7,932,733 B2
(45) Date of Patent: Apr. 26, 2011

(54) APPARATUS FOR DETECTING DEFECT BY EXAMINING ELECTRIC CHARACTERISTICS OF A SEMICONDUCTOR DEVICE

(75) Inventors: Masahiro Sasajima, Hitachinaka (JP); Hiroyuki Suzuki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 160 days.

(21) Appl. No.: 12/370,915

(22) Filed: Feb. 13, 2009

(65) Prior Publication Data
US 2009/0224788 A1 Sep. 10, 2009

(30) Foreign Application Priority Data
Feb. 15, 2008 (JP) .................. 2008-035242

(51) Int. Cl.
*G01R 31/00* (2006.01)
*G01R 31/10* (2006.01)
(52) U.S. Cl. .......... 324/750.01; 324/750.03; 324/750.05
(58) Field of Classification Search .......... None
See application file for complete search history.

(56) References Cited

U.S. PATENT DOCUMENTS

| | | | | |
|---|---|---|---|---|
| 4,567,432 A | * | 1/1986 | Buol et al. | 324/760 |
| 4,982,153 A | * | 1/1991 | Collins et al. | 324/760 |
| 6,124,725 A | * | 9/2000 | Sato | 324/765 |
| 6,545,458 B2 | * | 4/2003 | Yamazaki | 324/158.1 |
| 6,710,613 B2 | * | 3/2004 | Sauerland | 324/760 |
| 6,744,270 B2 | * | 6/2004 | Stone | 324/765 |
| 6,864,698 B2 | * | 3/2005 | Mirkhani et al. | 324/760 |
| 2008/0149848 A1 | | 6/2008 | Suzuki et al. | |

FOREIGN PATENT DOCUMENTS

| | | |
|---|---|---|
| JP | 05-114634 | 5/1993 |
| JP | 2000-258491 | 9/2000 |
| JP | 2008-157650 | 7/2008 |

OTHER PUBLICATIONS

Japanese Office Action, issued in Japanese Patent Application No. 2008-035242, dated Jun. 15, 2008.

* cited by examiner

*Primary Examiner* — Vinh P Nguyen
(74) *Attorney, Agent, or Firm* — McDermott Will & Emery LLP

(57) ABSTRACT

An exemplary apparatus for detecting defect is capable of measuring temperature characteristics of a semiconductor sample without restrictions in the movement range of a sample stage and a probe device by a temperature control device. A heater heats a sample stage, and the sample stage is cooled by a refrigerant contained in a refrigerant container through a heat transfer line connected to the sample stage, a first heat receiving portion connected to the heat transfer line, a second heat receiving portion that is detachable from the heat receiving portion, a heat transfer line connected to the heat receiving portion, and a heat transfer rod connected to the heat transfer line, thereby adjusting the temperature of a semiconductor sample held by the sample stage. The heat receiving portions are separated from each other to release the restriction of the sample stage and a probe device such that the sample stage and the, probe device can be moved in a sample chamber.

9 Claims, 8 Drawing Sheets

US 7,932,733 B2

APPARATUS FOR DETECTING DEFECT BY EXAMINING ELECTRIC CHARACTERISTICS OF A SEMICONDUCTOR DEVICE

BACKGROUND OF THE INVENTION

1. Field of the Invention

The present invention relates to an apparatus for detecting defect capable of examining electric characteristics of a semiconductor device.

2. Description of the Related Art

In a process of measuring the electric characteristics of a semiconductor device formed on a semiconductor chip, electric characteristics for evaluating the reliability and stability of a semiconductor device are measured in addition to the electric characteristics of an electric circuit or the electric characteristics of a transistor.

For example, as a conventional technique that controls the temperature of a semiconductor device when the temperature characteristics of the semiconductor device is measured, a temperature control device has been proposed which includes a heater that heats a semiconductor device and a cooling unit that cools the semiconductor device and adjusts the amount of current flowing through the heater and the amount of refrigerant flowing through a cooling pipe communicating with the cooling unit to control the temperature of the semiconductor device (for example, Japanese Patent Application Laid-Open (JP-A) No. 2000-258491).

The width of an electronic circuit pattern of a semiconductor device formed on a semiconductor chip has been reduced. For example, when the electric characteristics of the semiconductor device having a fine circuit pattern are measured, a detecting apparatus has been used in which a probe is provided in a sample chamber of a scanning electron microscope (SEM) in a vacuum state. When such detecting apparatus is used, an operator contacts the leading end of the probe with a desired point of the semiconductor device while observing the semiconductor device, which is a measurement target, using the scanning electron microscope, thereby measuring the electric characteristics of a minute semiconductor device. In the detecting apparatus, it takes a long time to change the sample chamber from an atmospheric state to a vacuum state. Therefore, operations, such as the coarse positioning of a semiconductor device (sample), the replacement of a probe to a sample, and the replacement of a probe, are performed in the sample chamber in a vacuum state. A sample stage or a base stage holding a probe device is moved to a predetermined position inside the sample chamber to perform these operations. In this case, in the technique disclosed in JP-A No. 2000-258491, a power supply for a heater or a cooling pipe is connected outside a vacuum chamber. Therefore, the movement of the sample stage is restricted by a connection member outside the vacuum chamber. As a result, it is difficult to move the stage to a predetermined position.

SUMMARY OF THE INVENTION

The present invention has been made in order to solve the above-mentioned problems, and an object of the present invention is to provide an apparatus for detecting defect which is capable of measuring temperature characteristics of a semiconductor sample without restrictions in the movement range of a sample stage and a probe device by a temperature control device.

In order to achieve the object, the present invention provides an apparatus for detecting defect includes: a sample stage that holds a sample; a driving device that drives the sample stage; a heater that is provided in the sample stage and heats the sample stage; a first heat transfer portion that is connected to the sample stage; a second heat transfer portion that is detachable from the first heat transfer portion; and a refrigerant storage that is connected to the second heat transfer portion and contains a refrigerant.

According to the present invention, it is possible to measure temperature characteristics of a semiconductor sample without restrictions in the movement range of a sample stage and a probe device by a temperature control device.

DESCRIPTION OF PREFERRED EMBODIMENT

Hereinafter, exemplary embodiments of the present invention will be described with reference to the accompanying drawings.

A first embodiment of the present invention will be described with reference to FIGS. 1 to 6C.

Figure 1:
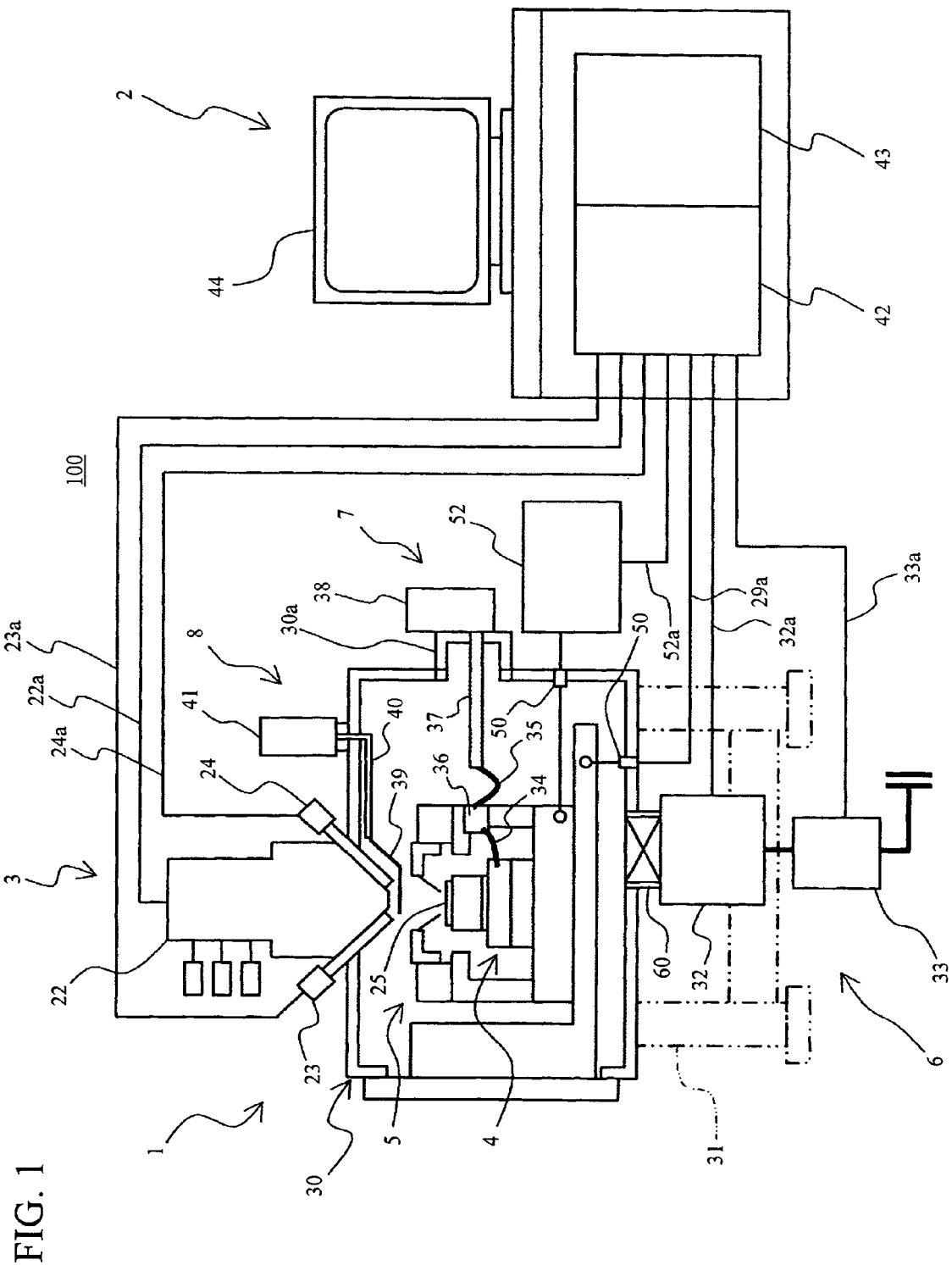
FIG. 1 is a diagram illustrating a detecting unit of an apparatus for detecting defect according to a first embodiment of the present invention, as viewed from the front side.
Figure 2:
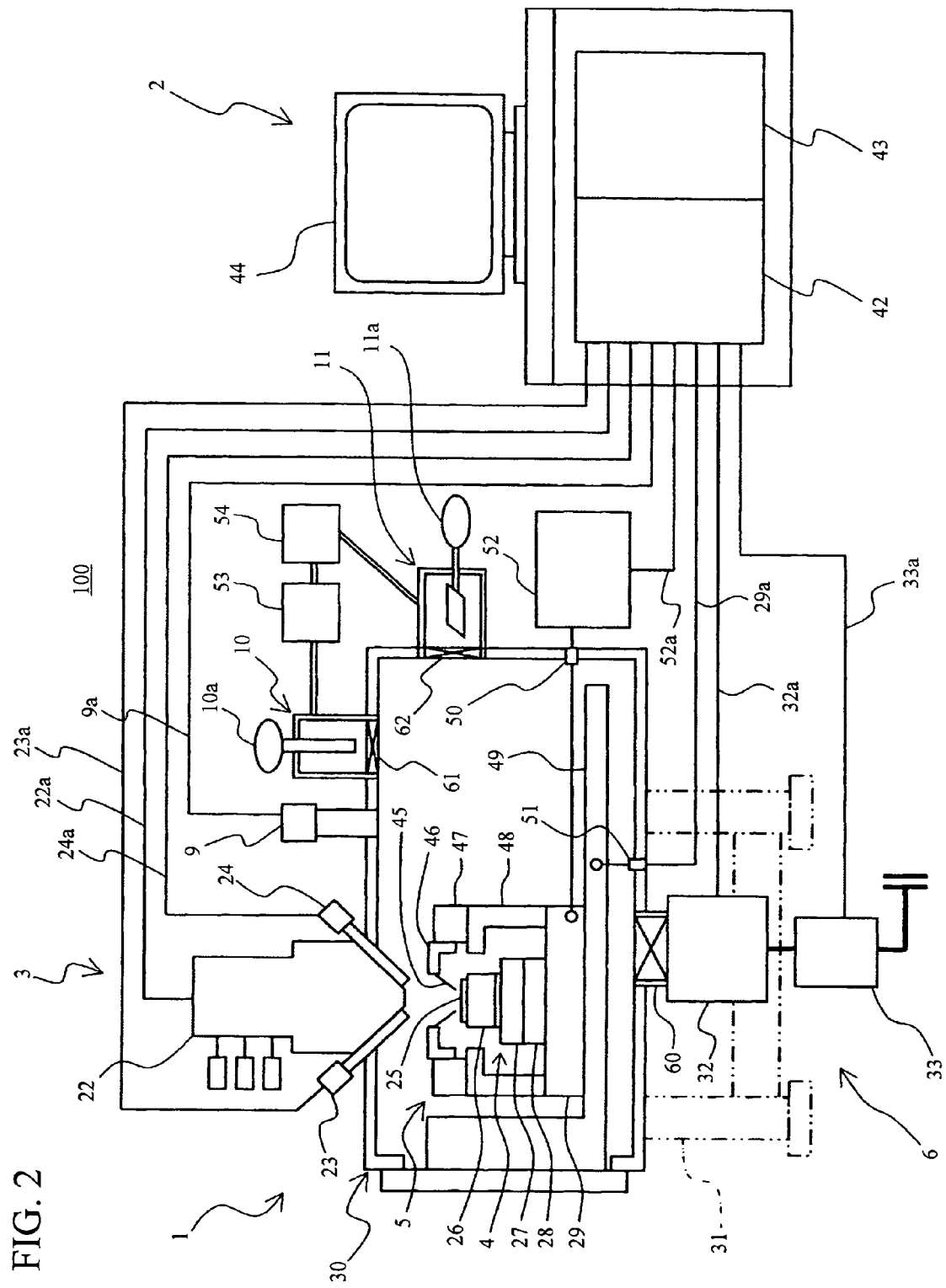
FIG. 2 is a diagram illustrating the detecting unit of the apparatus for detecting defect according to the first embodiment of the present invention, as viewed from the side.

FIG. 1 is a diagram schematically illustrating the structure of a detecting unit 1 of an apparatus for detecting defect 100, as viewed in an X direction (front surface, see FIG. 5), which will be described below. FIG. 2 is a diagram schematically illustrating the structure of the detecting unit 1, as viewed in a Y direction (side surface, see FIG. 5).

In FIGS. 1 and 2, the apparatus for detecting defect 100 includes the detecting unit 1 and a control unit 2.

The detecting unit 1 of the apparatus for detecting defect 100 includes an electron optical system device 3, a sample driving device 4, a sample measuring device 5, a pump device 6, a sample temperature adjusting device 7, a cold trap device 8, a probe coarse positioning mechanism 9, a probe replacement mechanism 10, a semiconductor sample replacement mechanism 11, and a sample chamber 30.

The electron optical system device 3 is, for example, a scanning electron microscope (SEM), and includes an electron beam optical system 22 including an electron gun that radiates a primary electron beam to a semiconductor sample 25, which is a measurement target, a secondary electron detector 23 that detects a secondary electron generated from the semiconductor sample 25 by the primary electron beam, and a Z sensor 24 that measures the distance between the semiconductor sample 25 and the electron beam optical system 22 in order to calculate the focal distance of the primary electron beam. The electron beam optical system 22 according to the embodiment forms a radiation optical system that radiates the primary electron beam to the semiconductor sample 25 and scans it, and includes an electron source that generates an electron beam, a deflection device that scans the electron beam, and a lens that condenses the electron beam. The electron beam optical system 22 is connected to a control device 42 of the control unit 2 through a transmission line 22a. The control device 42 controls the operation of the electron beam optical system 22, such as the application of a beam emission voltage of the electron source or the application of a voltage to the deflection lens.

The sample chamber 30 (vacuum chamber) partitions a space into an atmospheric pressure region and a vacuum region. In the sample chamber 30, the electron beam radiating unit of the electron optical system device 3 (hereinafter, referred to as a SEM), a sensor unit of the secondary electron detector 23 that detects a secondary electron, and a sensor unit of the Z sensor 24 are arranged. Portions of the sample chamber 30 to which a power source and transmission lines 22a, 23a, and 24a are connected are protruded toward the outside of the sample chamber 30. That is, the SEM 3, the secondary electron detector 23, and the Z sensor 24 are provided so as to pass through the partition wall of the sample chamber 30. In addition, the sample chamber 30 is supported by a table 31 having a vibration isolation function.

The pump device 6 includes a turbo-molecular pump (TMP) 32 that is connected to the sample chamber 30 through a gate valve 60 and a dry pump (DP) 33 that is connected to the turbo-molecular pump 32. The TMP 32 and the DP 33 are driven to exhaust air from the sample chamber 30 (vacuum process). The control device 42 is connected to the TMP 32 and the DP 33 through transmission lines 32a and 33a and controls the operations of the TMP 32 and the DP 33.

The cold trap device 8 includes a trap portion 39 that is provided in a space between the SEM 3 and the semiconductor sample 25, a refrigerant container 41 that is provided outside the sample chamber 30, and a heat transfer rod 40 that connects the trap portion 39 and the refrigerant container 41. The refrigerant container 41 has a structure that insulates heat from the outside, and has a refrigerant (for example, a liquid nitrogen) stored therein. The heat transfer rod 40 is made of a material having high thermal conductivity (for example, copper). The trap portion 39 is cooled by the refrigerant stored in the refrigerant container 41 through the heat transfer rod 40.

Figure 3:
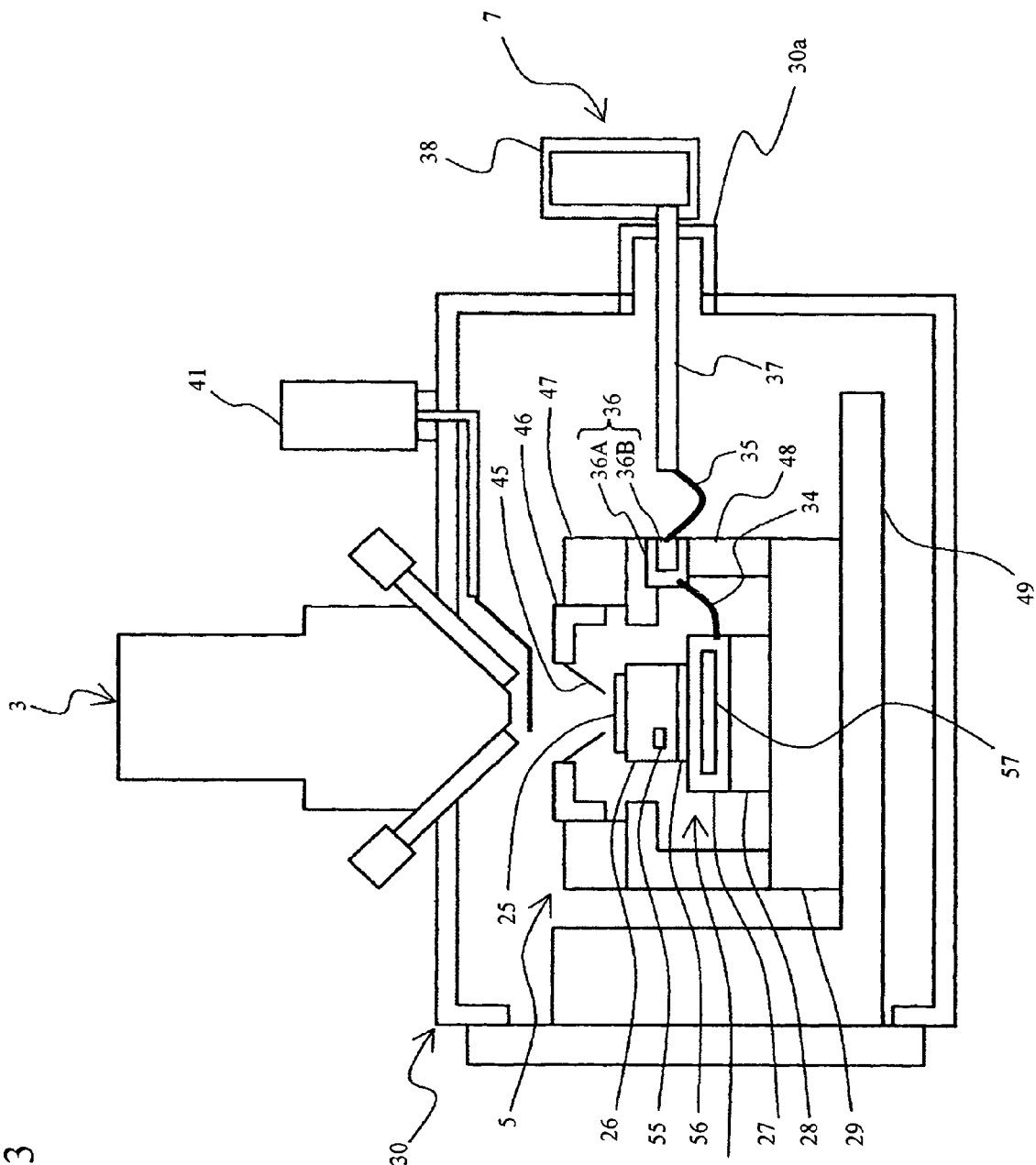
FIG. 3 is a diagram illustrating the details of a sample driving device, a sample measuring device, and a temperature adjusting device.
Figure 4:
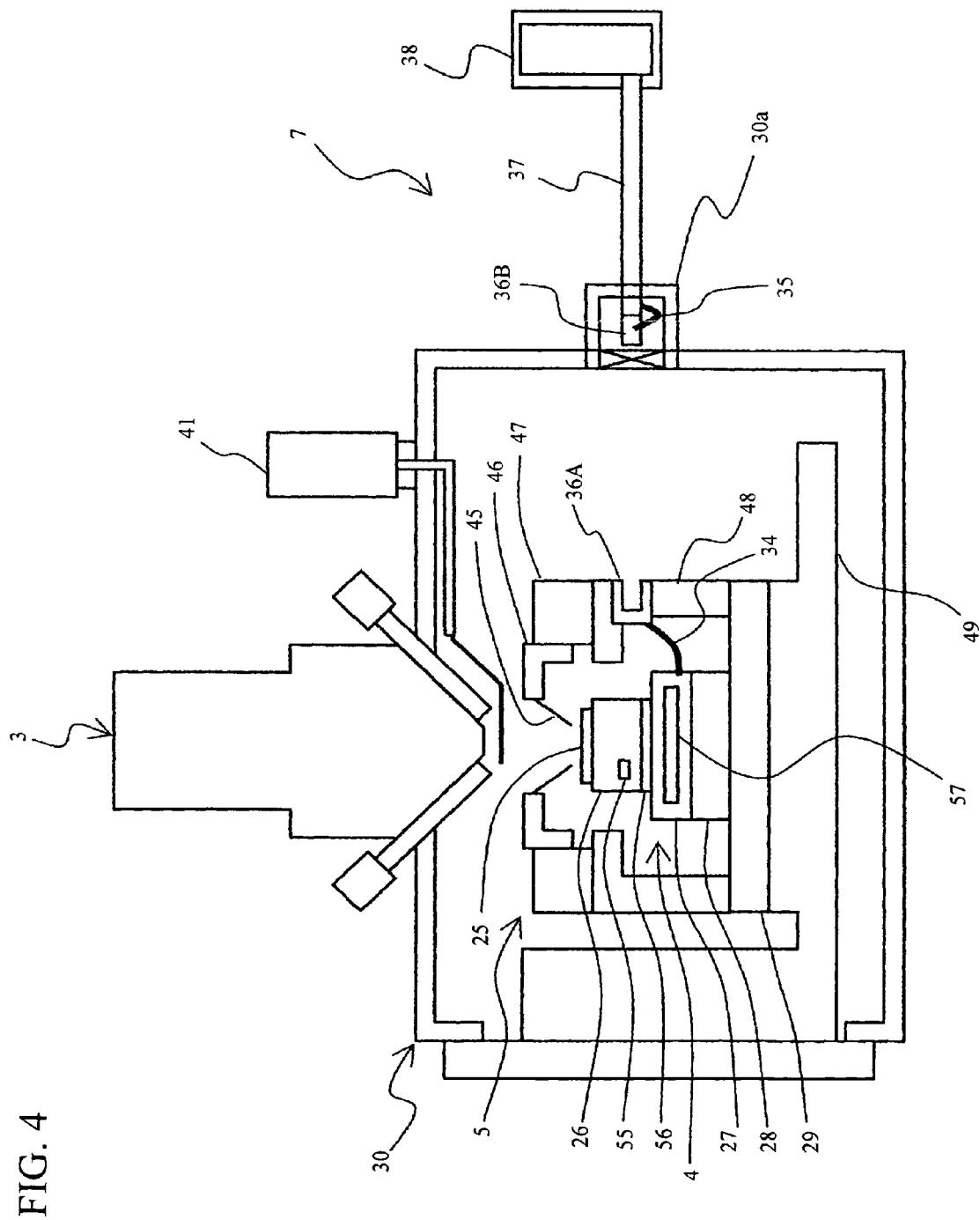
FIG. 4 is a diagram illustrating the details of the sample driving device, the sample measuring device, and the temperature adjusting device.
Figure 5:
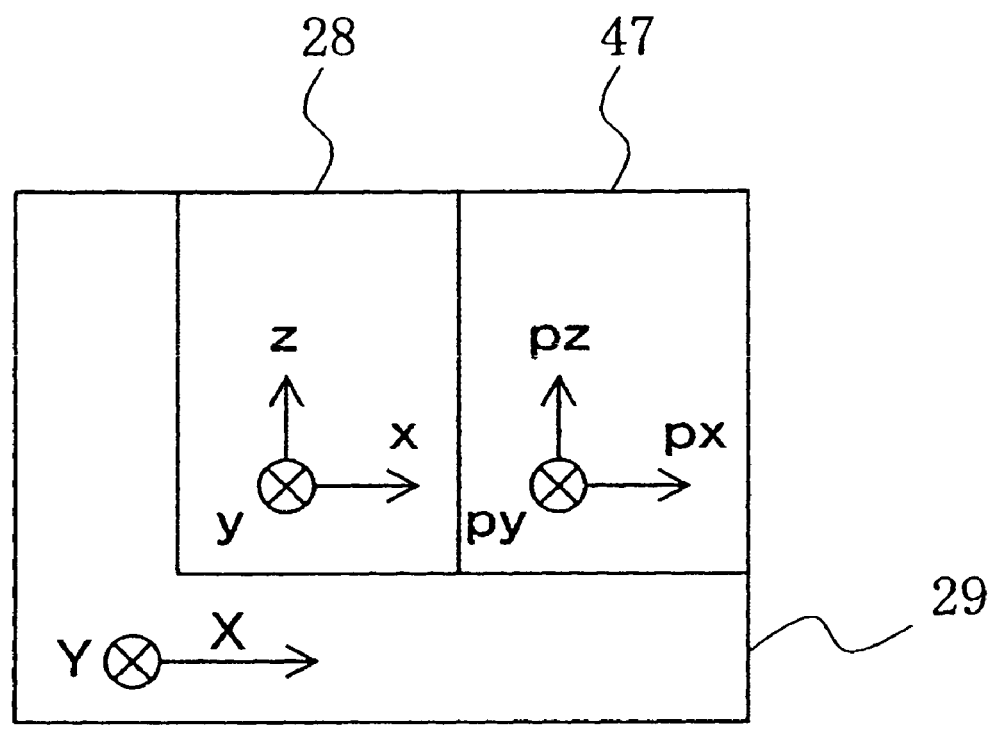
FIG. 5 is a diagram illustrating the moving coordinate system of a small stage, a large stage, and a probe unit.
Figure 6A:
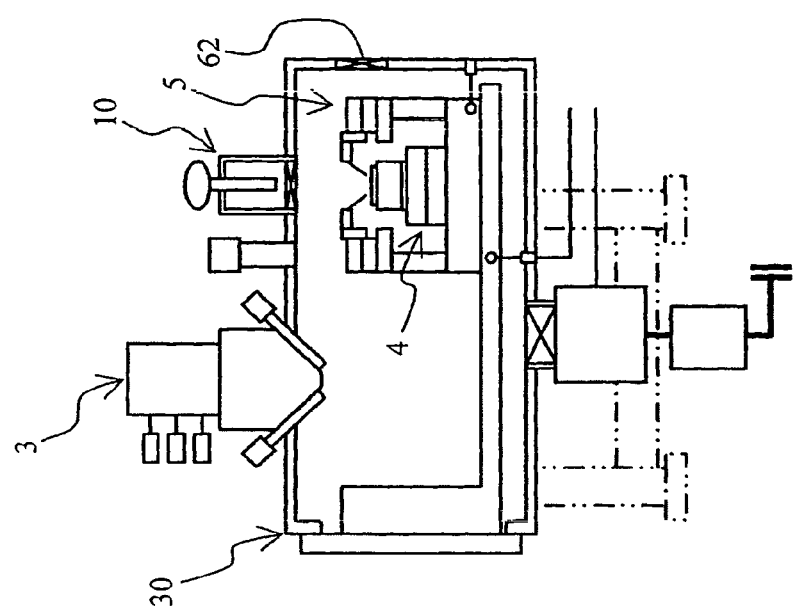
FIGS. 6A to 6C are diagrams illustrating the movement of the large stage to an observation/measurement position, a probe coarse positioning position, a sample replacement position, and a probe replacement position.
Figure 6B:
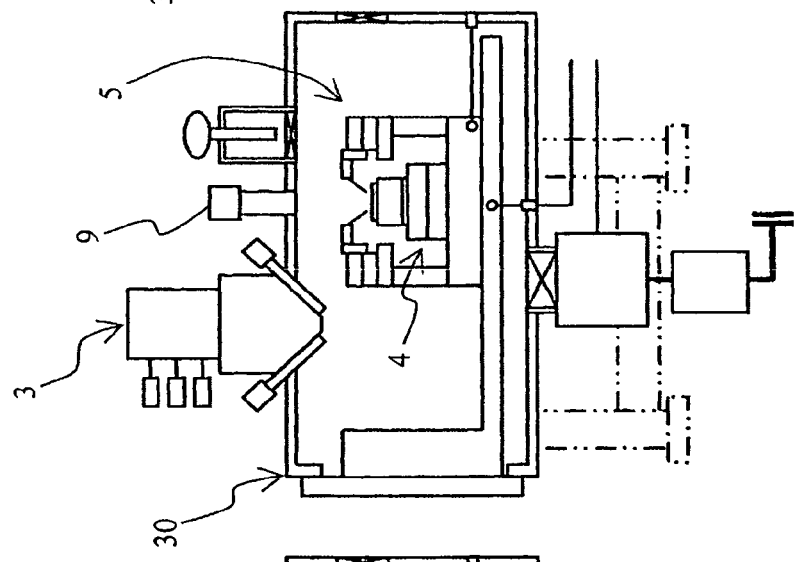
Figure 6C:
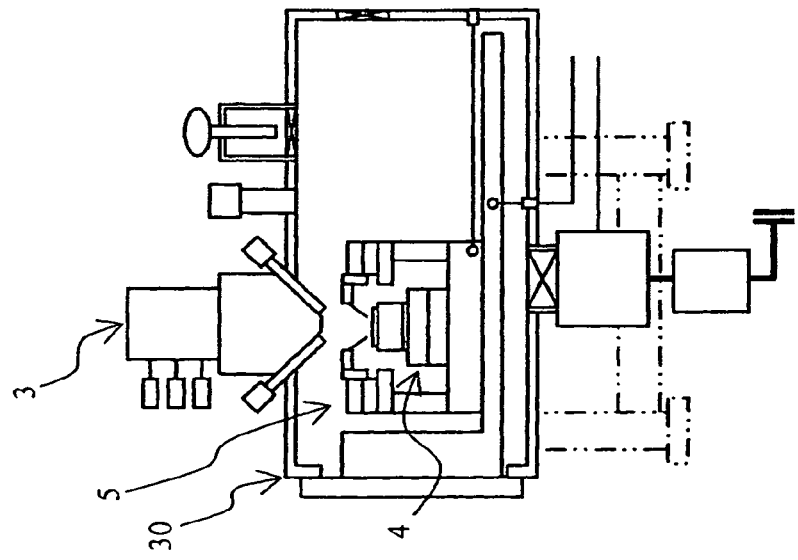

The details of the sample driving device 4, the sample measuring device 5, and the temperature adjusting device 7 will be described with reference to FIGS. 3 to 6C. FIGS. 3 and 4 are diagrams illustrating the details of the sample driving device 4, the sample measuring device 5, and the temperature adjusting device 7. FIG. 5 is a diagram illustrating the moving coordinate systems of a small stage 28, a large stage 29, and a probe unit 47. FIGS. 6A to 6C are diagrams illustrating the movement of the large stage 29 to an observation/measurement position, a probe coarse positioning position, a sample replacement position, and a probe replacement position, which will be described below.

In FIGS. 3 and 4, the sample driving device 4 includes a sample holder 26 that holds the semiconductor sample 25, a sample temperature adjusting portion 27 that holds the sample holder 26, the small stage 28 that holds the sample temperature adjusting portion 27, and the large stage 29 that holds the small stage 28. The sample holder 26, the sample temperature adjusting portion 27, and the small stage 28 are referred to as a sample stage.

An insulating sheet 56 having high electrical insulation and high thermal conductivity is provided between the sample holder 26 and the sample temperature adjusting portion 27. That is, the insulating sheet 56 electrically insulates the sample holder 26 from the sample temperature adjusting portion 27, but allows the movement of heat between the sample holder 26 and the sample temperature adjusting portion 27. The sample temperature adjusting portion 27 is made of a material having high electrical conductivity. The sample temperature adjusting portion (conductive portion) 27 and the insulating sheet (insulating portion) 56 are referred to as an intermediate layer.

The small stage 28 includes a driving device that drives the small stage in the x, y (horizontal), and z (vertical) directions (see FIG. 5) relative to the large stage 29. The small stage 28 is driven to move the sample stage.

The large stage 29 is mounted on a base stage 49 that is provided in the sample chamber 30, and includes a driving device 3 that drives the large stage in the X and Y (horizontal) directions (see FIG. 5) relative to the base stage 49. The driving device moves the large stage 29 to any one of the observation/measurement position, the probe coarse positioning position, the sample replacement position, and the probe replacement position (see FIGS. 6A to 6C).

In FIGS. 6A to 6C, FIG. 6A shows the observation/measurement position where the operator contacts the probe 45 of the sample measuring device 5 with a desired point of the semiconductor sample 25 while observing the semiconductor sample 25 using the SEM 3. In addition, at the observation/measurement position, an electric characteristic measuring device 52 of the sample measuring device 5 measures, for example, electric characteristics of the semiconductor sample 25. Further, a heat receiving portion 36 of the sample temperature adjusting device 7 is attached or detached at the observation/measurement position (which will be described below). FIG. 6B shows the probe coarse positioning position where the operator can observe a probe contact target position of the semiconductor sample 25 and the position of the probe 45 using the SEM 3 while observing the positional relationship between the semiconductor sample 25 and the probe 45 using an observation image having a viewing angle that is wider than that of the SEM 3, such as an optical microscope (not shown) provided in the probe coarse positioning mechanism 9. FIG. 6C shows the probe replacement position where a probe replacement device 10a of the probe replacement mechanism 10 replaces the probe 45 of the sample measuring device 5 with a desired probe. In addition, at the probe replacement position shown in FIG. 6C, a sample replacement device 11a of the sample replacement mechanism 11 replaces the semiconductor sample 25 held by the sample holder 26 of the sample driving device 4 with another one. In FIG. 6C, the probe replacement position is the same as the sample replacement position, but the probe replacement position and the sample replacement position may be different from each other.

The sample measuring device 5 includes a plurality of probes 45 (for example, six probes) (FIGS. 3 and 4 show only two probes) that are contacted with desired points of the semiconductor sample 25 (for example, a circuit pattern formed on the semiconductor sample 25), a plurality of probe holders 46 that hold the probes (for example, mechanical probes) 45, a probe stage 47 that holds each of the probe holders 46, a probe unit base 48 that holds the probe stage 47, and the electric characteristic measuring device (for example, a semiconductor parameter analyzer) 52 (for example, see FIG. 1) that measures the logical operation or the electric characteristics of the semiconductor sample 25 using each of the probes 45. The whole of the probes 45, the probe holders 46, and the probe stage 47 is referred to as a probe unit, and the whole of the probe unit and the probe unit base 48 is referred to as a probe device. The probes 45 can be removed together with some or all of the probe holders 46, and replaced with various probes that have different shapes or are made of different materials.

The probe stage 47 includes a driving device that moves the probe stage in px, py (horizontal), and pz (vertical) directions (see FIG. 5) relative to the probe unit base 48. The probe unit base 48 is fixed to the upper surface of the large stage 29. Therefore, it is possible to adjust the position of the probe 45 relative to a sample stage (the semiconductor sample 25) by relatively moving the probe stage 47 relative to the probe unit base 48. The driving device of the probe stage 47 may include, for example, a piezo-electric element. In this case, it is possible to finely adjust the position of the probe 45.

The sample stage can drive the small stage 28 to move the semiconductor sample 25. The probe device can drive the probe stage 47 to move a plurality of probes 45. The large stage 29 can integrally drive the sample stage and the probe device. Therefore, it is possible to drive the semiconductor sample 25 and the probe 45 independently or integrally. That is, the large stage 29 moves both the semiconductor sample 25 and the probes 45 to any one of the observation/measurement position, the probe coarse positioning position, the sample replacement position, and the probe replacement position (see FIGS. 6A to 6C).

The electric characteristic measuring device 52 is arranged outside the sample chamber 30, and the probe device is arranged in the sample chamber 30. The electric characteristic measuring device 52 and the probes 45 are connected to transmission lines 29a passing through field-throughs 50 (see FIG. 1 and the like) provided in the partition wall of the sample chamber 30. The electric characteristic measuring device 52 includes a power supply means (not shown) that applies a predetermined current or voltage to a desired point of the semiconductor sample 25 through the probe 45, and a detecting means (not shown) that detects the current or voltage of a desired point of the semiconductor sample 25. The electric characteristic measuring device 52 uses the power supply device and the detecting device to measure the current-voltage characteristics of the semiconductor sample 25 through the probes 45, and calculates desired characteristic values on the basis of the current-voltage characteristics. The characteristic values include, for example, a current value, a voltage value, and a resistance value of the contact point of the probe 45. As in the embodiment, when the semiconductor sample 25 is used as a measurement target sample, for example, a semiconductor parameter analyzer is used as the electric characteristic measuring device 52. The characteristic values and the waveform of the current-voltage characteristics of the semiconductor sample 25 obtained by the electric characteristic measuring device 52 (hereinafter, simply referred to as electric characteristic data) are displayed on a display unit (not shown) provided in the electric characteristic measuring device 52, and also transmitted to the control device 42 of the control unit 2 through a transmission line 52a.

Each of the driving device of the sample driving device 4 and the sample measuring device 5 are connected to the control device 42 by the transmission lines 29a passing through the field-throughs 51 provided in the partition wall of the sample chamber 30, and the control device 42 controls the operations of each of the driving device.

In FIGS. 3 and 4, the sample temperature adjusting device 7 is provided in the sample holder 26 of the sample driving device 4, and includes a temperature sensor 55 that detects the temperature of the sample holder 26, a heater 57 that is provided in the sample temperature adjusting portion 27 of the sample driving device 4 to heat the sample temperature adjusting portion 27, a heat receiving portion 36 that is provided in the sample measuring device 5, a heat transfer line 34 that connects the sample temperature adjusting portion 27 and the heat receiving portion 36 to transfer heat between the sample temperature adjusting portion 27 and the heat receiving portion 36, a refrigerant container 38, a heat transfer rod 37 that is connected to the refrigerant container 38 and is cooled by a refrigerant in the refrigerant container 38, and a heat transfer line 35 that connects the heat receiving portion 36 and the heat transfer rod 37 to transfer heat between the heat receiving portion 36 and the heat transfer rod 37.

The heat receiving portion 36 is provided on the probe unit base 48 of the sample measuring device 5, and includes a heat receiving portion 36A that is connected to the sample temperature adjusting portion 27 by the heat transfer line 34 and a heat receiving portion 36B that is connected to the heat transfer rod 37 by the heat transfer line 35 and is provided so as to be detachable from the heat receiving portion 36A. That is, the heat receiving portion 36A can be connected to or separated from the heat receiving portion 36B. In addition, the heat receiving portion 36B may be detachable from the heat receiving portion 36A.

The heat transfer line 34 is made of a flexible material, and has a length that allows the movement of the sample stage on the large stage 29 in a movable range, regardless of the relative position between the sample stage and the probe unit base 48.

Similarly, the heat transfer line 35 is made of a flexible material, and has a length that allows the movement of the sample stage in a movable range that is predetermined as the observation/measurement position, with the heat receiving portion 36A being connected to the heat receiving portion 36B. However, the heat transfer line 35 does not have a length enabling the large stage 29 to be moved to positions other than the observation/measurement position (the probe coarse positioning position, the probe replacement position, and the sample replacement position), and the heat receiving portion 36A and the heat receiving portion 36B are separated from each other at the positions other than the observation/measurement position.

The heat transfer lines 34 and 35 are made of a material having high thermal conductivity, such as copper.

The heat transfer rod 37 passes through the partition wall of a waiting room 30a that is protruded from the side surface of the partition wall of the sample chamber 30, and slides in the forward or backward direction with respect to the sample stage. A space between the heat transfer rod 37 and the sample chamber 30 is sealed by a sealing means (not shown), and the sample chamber 30 is airtightly sealed. A portion of the heat transfer rod 37 that is exposed to air (a portion that protrudes toward the outside of the sample chamber 30) has a heat insulating structure (not shown), and prevents dew condensation due to the contact of the heat transfer rod 37 cooled by the refrigerant with air.

The refrigerant container 38 is a refrigerant storage that has a heat insulating structure (not shown) with respect to air, and contains a refrigerant (for example, a liquid nitrogen) therein. Therefore, when the heat receiving portion 36A and the heat receiving portion 36B are connected to each other, the sample temperature adjusting portion 27 is cooled by the refrigerant of the refrigerant container 38 through the heat transfer line 34, the heat receiving portion 36, the heat transfer line 35, and the heat transfer rod 37.

For example, the refrigerant container 38 is provided on a rail (not shown) that extends in the direction in which the heat transfer rod 37 slides, and is moved along the rail in the horizontal direction by a driving device (not shown) such that the distance to the sample chamber 30 is changed. When the refrigerant container 38 is moved close to the sample chamber 30, the heat transfer rod 37 connected to the refrigerant container 38 slides to the inside of the sample chamber 30. When the refrigerant container 38 is moved so as to be away from the sample chamber 30, the heat transfer rod 37 slides to the outside of the sample chamber 30.

The heat transfer rod 37 slides to the inside of the sample chamber 30 to be contacted with the heat receiving portion 36B, and an attaching/detaching mechanism (not shown) that is provided outside the sample chamber 30 is used to connect the heat transfer rod 37 and the heat receiving portion 36B. Similarly, the attaching/detaching mechanism (not shown) is used to separate the heat receiving portion 36A from the heat receiving portion 36B to slide the heat transfer rod 37 to the outside of the sample chamber 30. Then, the heat receiving portion 36B is separated from the heat receiving portion 36A. The attaching/detaching mechanism between the heat transfer rod 37 and the heat receiving portion 36B is not particularly limited. For example, the following structure may be used. First, the leading end of the heat transfer rod 37 is inserted into or removed from the heat receiving portion 36B. Then, a groove which extends in the sliding direction of the heat transfer rod 37 and has a stage-side leading end curved in the circumferential direction is formed in the inner circumferential surface of the heat receiving portion 36B, and a pin that is engaged with the groove is provided at the leading end of the heat transfer rod 37. That is, the heat transfer rod 37 is rotated on the axial line to engage or disengage the pin with or from the curved portion of the groove, thereby connecting or separating the heat transfer rod 37 to or from the heat receiving portion 36B.

As shown in FIG. 4, when the heat receiving portion 36B is separated from the heat receiving portion 36A and connected to the heat transfer rod 37 and the heat transfer rod 37 is moved to the outside of the sample chamber 30, the heat receiving portion 36B is moved to the waiting room 30a. In this case, a gate valve 63 that partitions the waiting room 30a from the sample chamber 30 can be closed to maintain the airtightness of the sample chamber 30 at a high level.

In addition, contrary to the procedure, the heat transfer rod 37 slides to the inside of the sample chamber 30 to be contact the heat receiving portion 36B connected to the heat transfer rod 37 with the heat receiving portion 36A, and an attaching/detaching mechanism (not shown) that is provided outside of the sample chamber 30 is used to connect the heat receiving portion 36A and the heat receiving portion 36B. Similarly, the attaching/detaching mechanism (not shown) is used to separate the heat receiving portion 36B from the heat transfer rod 37, and the heat transfer rod 37 slides to the outside of the sample chamber 30 to connect the heat receiving portion 36A and the heat receiving portion 36B. The large stage 29 is moved to the observation/measurement position to connect or separate the heat receiving portion 36A to or from the heat receiving portion 36B.

The heat receiving portion 36A has a certain amount of heat capacity. The heat capacity of the heat receiving portion 36A means heat capacity capable of maintaining the heat receiving portion 36A, after it is cooled to a predetermined set temperature or less, at a temperature that is less than a predetermined reference temperature for a predetermined reference time, with the heat receiving portion 36A being separated from the heat receiving portion 36B. In this case, the reference temperature is, for example, the lowest temperature in the temperature range set when the electric characteristics of the semiconductor sample 25 are measured by the apparatus for detecting defect 100 according to the embodiment. The reference time is, for example, the time from when the heat receiving portion 36A and the heat receiving portion 36B are connected to each other at the observation/measurement position of the large stage 29 to when the heat receiving portion 36A is separated from the heat receiving portion 36B and the large stage 29 is moved to the probe replacement position to replace the probe 45 and then returns to the observation/measurement position to connect the heat receiving portion 36A and the heat receiving portion 36B. The temperature is related to the heat capacity of the heat receiving portion 36A. Therefore, the temperature is set depending on the heat capacity of the heat receiving portion 36A.

The heat transfer line 34 and the heat receiving portion 36A form a first heat transfer portion connected to the sample stage, and the heat receiving portion 36B, the heat transfer line 35, and the heat transfer rod 37 form a second heat transfer portion that is detachable from the first heat transfer portion. The refrigerant container 38 forms a storage that is connected to the second heat transfer portion and contains a refrigerant.

Returning to FIGS. 1 and 2, the probe coarse positioning mechanism 9 includes an optical microscope for probe coarse positioning and a CCD camera (not shown) for obtaining an observation image (image) of the optical microscope, and acquires the observation images of the semiconductor sample 25 and the probe 45 captured by the optical microscope. The probe coarse positioning mechanism 9 drives the probe unit 47 to move the probe 45 in the horizontal direction and the vertical direction, while observing the positional relationship between the semiconductor sample 25 and the probe 45 in the horizontal direction and the vertical direction from the observation image captured by, for example, an optical microscope having a viewing angle that is wider than that of the SEM 3 (having a low magnification), such that the SEM 3 can observe a probe contact target position of the semiconductor sample 25 and the position of the probe 45. FIG. 2 shows only the probe coarse positioning mechanism 9 that acquires the observation image of the semiconductor sample 25 from the upper side, but a probe coarse positioning mechanism that acquires the observation image in the lateral direction (horizontal direction) is not shown in FIG. 2.

The probe replacement mechanism 10 includes a probe replacement device 10a that replaces the probe 45, and is connected to the inside of the sample chamber 30 through a gate valve 61. The probe replacement mechanism 10 is connected to a turbo-molecular pump (TMP) 53, and the turbo-molecular pump 53 is connected to a dry pump (DP) 54. The TMP 53 and the DP 54 are driven to exhaust air from the probe replacement mechanism 10 (vacuum process). Therefore, the probe replacement device 10a replaces the probe 45 in the sample chamber 30 in a vacuum state.

The sample replacement mechanism 11 includes a sample replacement device 11a that replaces the semiconductor sample 25, and is connected to the inside of the sample chamber 30 through a gate valve 62. The sample replacement mechanism 11 is connected to the DP 54, and the DP 54 is driven to exhaust air from the sample replacement mechanism 11 (vacuum process). Therefore, the sample replacement device 11*a* replaces the semiconductor sample 25 in the sample chamber 30 in a vacuum state.

The control unit 2 of the apparatus for detecting defect 100 includes the control device 42, a power source device 43, and a display device 44. The control device 42 controls the overall operation of the apparatus for detecting defect 100, and controls the optical conditions, magnification, focus, and image shift of the SEM 3, the brightness of a SEM image, a scanning speed, alignment, the recording of an image, the position of the sample stage of the sample driving device 4, and the position of each of the probes 45 of the sample measuring device 5 in response to the operation of a GUI (graphical user interface) of the display device 44 or commands input through a keyboard (not shown). In addition, the control device 42 controls the electron beam optical system 22 through the transmission line 22*a* to acquire a detection signal detected by the secondary electron detector 23 through the transmission line 23*a*, and controls the operations of the sample driving device 4, the sample measuring device 5, the pump device 6, the sample temperature adjusting device 7, and the probe coarse positioning mechanism 9. Further, the control device controls the display device 44 to display an image obtained by the SEM 3 and an image obtained by the probe coarse positioning mechanism 9. In addition, the control device 42 analyzes the electric characteristic data of the semiconductor sample 25 measured by the electric characteristic measuring device 52 to determine whether a measured point of the semiconductor sample 25 is defective or normal, and controls the display device 44 to display the electric characteristic data of the measured point and the measured result.

The power supply device 43 supplies power to the entire apparatus for detecting defect 100, and the control device 42 controls the power supplied by the power supply device.

The operation of the embodiment having the structure will be described.

(1) Vacuum Process

First, the control device 42 is operated to drive the pump device 6 to exhaust air from the sample chamber 30 (vacuum process). The subsequent operations are performed while maintaining the sample chamber 30 in a vacuum state.

(2) Load of Sample

Then, the heat receiving portion 36A is separated from the heat receiving portion 36B, and the large stage 29 is moved to the sample replacement position (see FIG. 6C).

At the sample replacement position, the gate valve 62 of the sample replacement mechanism 11 is opened, and the sample replacement device 11*a* is used to load the semiconductor sample 25 on the sample holder 26. In this case, the dry pump 52 is driven to exhaust air from the sample replacement mechanism 11 (vacuum process).

(3) Coarse Positioning of Probes

Then, the large stage 29 is moved to the probe coarse positioning position (see FIG. 6A).

At the probe coarse positioning position, the operator moves each of the probes 45 in the horizontal direction and the vertical direction while observing the observation image of the optical microscope of the probe coarse positioning mechanism 9 displayed on the device 44, such that the operator can observe the relative position of a measurement target portion of the semiconductor sample 25 and each of the probes 45 using the SEM 3.

(4) Probe Contact

Then, the operator contacts each of the probes 45 with a predetermined point of the semiconductor sample 25 while observing the measure target portion of the semiconductor sample 25 and each of the probes 45 using the SEM 3. In this way, the probe coarse positioning mechanism 9 is used to coarsely position the probes 45 with respect to the semiconductor sample 25, and the operator contacts the probes 45 with predetermined points of the semiconductor sample 25 while observing the image of the semiconductor sample 25 using the SEM 3. Therefore, the number of times the magnification of the SEM 3 is adjusted (adjustment time) is reduced. Therefore, it is possible to effectively measure the electric characteristics of the semiconductor sample 25.

In addition, the trap portion (cold trap) 39 of the cold trap device 8 is cooled to a temperature that is lower than that of the semiconductor sample 25, and traps gas molecules emitted from the surface or the inner portion of the semiconductor sample 25 by the primary electron beams radiated from the SEM 3. In this way, it is possible to prevent the contamination of the surface of the semiconductor sample 25 or the contamination of the probes 45.

(5) Measurement of Electric Characteristics (Room Temperature)

In this state, a power supply unit of the electric characteristic measuring device 52, such as a semiconductor parameter analyzer, is used to sweep a voltage and a current to a desired position of the semiconductor sample 25 through a desired probe 45. At the same time, the current and voltage of the probe contact position of the semiconductor sample 25 are measured through a desired probe 45 to obtain the waveform of the current-voltage characteristics of the semiconductor sample 25 at the room temperature. The electric characteristic measuring device 52 calculates desired characteristic values, such as a current value, a voltage value, and a resistance value, on the basis of the current-voltage characteristics, to display the characteristic values and the waveform of the current-voltage characteristics on a display (not shown) and to transmit the characteristic values to the control device 42 through the transmission line 52*a*. The control device 42 stores the characteristic values transmitted from the electric characteristic measuring device 52 in a storage device (not shown), and analyzes the characteristic values to determine whether the semiconductor sample 25 is defective. In addition, the control device 42 controls the display device 44 to display the characteristic values of the semiconductor sample 25 and the defect determination result. When the current-voltage characteristics of the semiconductor sample 25 at the room temperature are completely measured, the sweep of the voltage and the current to the semiconductor sample 25 stops.

(6) Sample Temperature Adjustment

Next, in order to measure the electric characteristics (temperature characteristics) of the semiconductor sample 25 with respect to the temperature, an input device of the control device 42 is used to set a target temperature of the semiconductor sample 25.

When the target temperature of the semiconductor sample 25 is lower than the room temperature, the heat receiving portion 36A is connected to the heat receiving portion 36B to adjust the temperature. The control device 42 includes a map indicating the relationship between the temperature of the sample stage and the temperature of the semiconductor sample 25 in advance. The control device 42 calculates the temperature of the semiconductor sample 25 using the map on the basis of the temperature of the sample stage obtained by the temperature sensor 55, and controls the heat capacity of the heater 57 such that the calculated temperature of the semiconductor sample 25 is close to the target temperature. When the target temperature is higher than the room temperature, the heat receiving portion 36A is separated from the heat receiving portion 36B to adjust the temperature. In this case, the control device 42 also controls the heat capacity of the heater 57 such that the temperature of the semiconductor sample 25 calculated from the temperature obtained by the temperature sensor 55 is close to the target temperature.

(7) Measurement of Electric Characteristics (Measurement of Temperature Characteristics)

When the temperature of the semiconductor sample 25 is stabilized to a desired set temperature, the electric characteristic measuring device 52 sweeps a voltage and a current to a probe contact point of the semiconductor sample 25 through a desired probe 45 and measures the current and voltage of the probe contact point of the semiconductor sample 25 through a desired probe 45 to obtain the waveform of the current-voltage characteristics of the semiconductor sample 25 at a desired measurement temperature. The electric characteristic measuring device 52 calculates characteristic values on the basis of the current-voltage characteristics, to display the characteristic values and the current-voltage characteristics on a display device (not shown), and to transmit the characteristic values to the control device 42 through the transmission line 52*a*. The control device 42 stores the characteristic values transmitted from the electric characteristic measuring device 52 in a storage device (not shown), and analyzes the characteristic values to determine whether the semiconductor sample 25 is defective. In addition, the control device controls the display device 44 to display the characteristic values of the semiconductor sample 25 and the defect determination result.

(8) Probe Replacement

When the probe 45 is replaced with another one having a different shape or for a different purpose or when the damaged probe 45 is replaced with a normal one during the measurement of the temperature characteristics of the semiconductor sample 25, the heat receiving portion 36A is separated from the heat receiving portion 36B, and the large stage 29 is moved to the probe replacement position (see FIG. 6C). At the probe replacement position, the probe replacement device 10*a* of the probe replacement mechanism 10 replaces the probe 45. Then, the large stage 29 is moved to the probe coarse positioning position, and the probe coarse positioning mechanism 9 coarsely positions the probe. Then, the large stage 29 is moved to the observation/measurement position, and the heat receiving portion 36A is connected to the heat receiving portion 36B. Then, the operator contacts the probe 45 with a predetermined point of the semiconductor sample 25 while observing the semiconductor sample 25 using the SEM 3, thereby measuring the electric characteristics.

As such, when the heat receiving portion 36A is temporarily separated from the heat receiving portion 36B during the measurement of the temperature characteristics of the semiconductor sample 25 and it is difficult to maintain the temperature of the semiconductor sample 25, the operator needs to wait until the temperature of the semiconductor sample 25 is stabilized to the target temperature after the large stage 29 returns to the observation/measurement position and the heat receiving portion 36A is connected to the heat receiving portion 36B. As a result, operation efficiency deteriorates. In the embodiment, the heat receiving portion 36A is separated from the heat receiving portion 36B, and probe replacement and probe coarse positioning are performed. Then, while the heat receiving portion 36A is connected to the heat receiving portion 36B, the temperature of the semiconductor sample 25 is maintained. Therefore, it is not necessary to wait until the temperature of the semiconductor sample 25 is stabilized. As a result, it is possible to effectively measure the temperature characteristics.

When the current-voltage characteristics of the semiconductor sample 25 at a desired temperature are completely measured, the sweep of the current and voltage to the semiconductor sample 25 stops.

(9) Sample Replacement

Then, the temperature of the semiconductor sample 25 returns to the room temperature, and the large stage 29 is moved to the sample replacement position. Then, the sample replacement device 11*a* of the sample replacement mechanism 11 performs the transportation out and the replacement of the semiconductor sample 25.

When the temperature of the semiconductor sample 25 is lower than the room temperature, the heat receiving portion 36A is separated from the heat receiving portion 36B, and the heater 57 heats the semiconductor sample 25 such that the temperature of the semiconductor sample 25 is equal to the room temperature. In this way, it is possible to shorten the time required for the temperature of the semiconductor sample 25 to be equal to the room temperature. When the temperature of the semiconductor sample 25 is higher than the room temperature, the heat receiving portion 36A is connected to the heat receiving portion 36B and the temperature of the semiconductor sample 25 returns to the room temperature. In this case, similarly, it is possible to shorten the time required for the temperature of the semiconductor sample 25 to be equal to the room temperature.

During a process of transporting the semiconductor sample 25 out from the sample chamber 30, when the temperature of the semiconductor sample 25 is lower than the room temperature (normal temperature), dew condensation occurs. When the temperature of the semiconductor sample 25 is higher than the room temperature, the operator is likely to be burned. Therefore, after the temperature of the semiconductor sample 25 returns to the room temperature, the semiconductor sample 25 is transported out. In the embodiment, it is possible to shorten the time required for the temperature of the semiconductor sample 25 to be equal to the room temperature. As a result, it is possible to effectively perform an operation.

In the embodiment having the structure, the heat receiving portion 36A and the heat receiving portion 36B of the sample temperature adjusting device 7 that adjusts the temperature of the semiconductor sample 25 can be separated from each other. Therefore, it is possible to measure the temperature characteristics of the semiconductor sample 25 without restrictions in the movement range of the sample stage and the probe device in the sample chamber 30 by the sample temperature adjusting device 7. In this way, it is possible to move the semiconductor sample 25 to the sample replacement position to replace it or move the probe 45 to the probe replacement position to replace it, while maintaining the replacement sample chamber 30 in a vacuum state. Therefore, it is not necessary to exhaust air from the sample chamber 30 whenever the semiconductor sample 25 or the probe 45 is replaced. As a result, it is possible to effectively measure the temperature characteristics of the semiconductor sample 25.

When a temperature adjusting device that makes a refrigerant flow to the sample stage having the semiconductor sample 25 loaded thereon to adjust the temperature of the semiconductor sample 25 is used, for example, if the probe 45 is contacted with a nanometer-order wiring pattern formed on the semiconductor sample 25 to measure the temperature characteristics of the semiconductor sample 25, the contact portion of the probe 45 or the semiconductor sample 25 is likely to be damaged due to vibration caused by the flow of the refrigerant. However, in the embodiment, since heat is transmitted through the heat transfer lines 34 and 35, the heat transfer rod 37, and the heat receiving portion 36, it is possible to prevent the vibration of the semiconductor sample 25. As a result, it is possible to improve the accuracy or the stability of measurement.

In addition, since the cold trap device 8 having the trap portion 39 that is cooled down to a temperature that is lower than the temperature of the semiconductor sample 25 is provided, it is possible to trap gas molecules emitted from the surface or the inner portion of the semiconductor sample 25 by the primary electron beams radiated from the SEM 3, while observing the semiconductor sample 25 using the SEM 3. In addition, it is possible to prevent the contamination of the surface of the semiconductor sample 25 or the contamination of the probes 45. As a result, it is possible to accurately measure the temperature characteristics.

In the embodiment, a SEM is used as the electron optical system device 3, but the present invention is not limited thereto. For example, instead of the SEM 3, a SIM (Scanning Ion Microscope) using an FIB (Focus Ion Beam) may be used.

Next, a second embodiment of the present invention will be described with reference to FIGS. 7 and 8.

Figure 7:
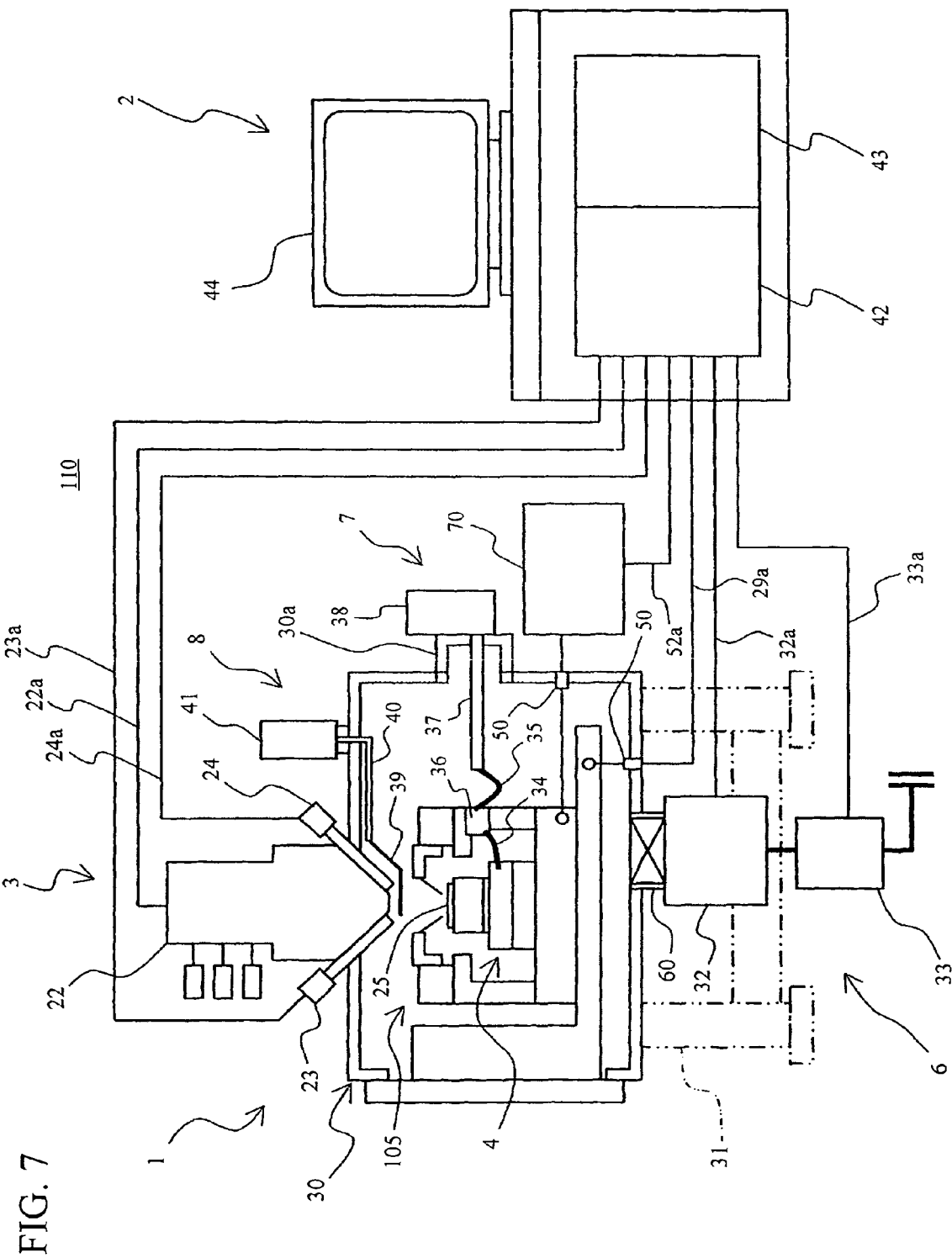
FIG. 7 is a diagram illustrating a detecting unit of an apparatus for detecting defect according to a second embodiment of the present invention, as viewed from the side.

FIG. 7 is a diagram illustrating the structure of a detecting unit of an apparatus for detecting defect 110 according to the second embodiment of the present invention, as viewed in the X direction. In FIG. 7, the same components as those in FIGS. 1 and 2 are denoted by the same reference numerals and a description thereof will be repeated.

In FIG. 7, a sample measuring device 105 of the apparatus for detecting defect 110 according to the embodiment includes a weak signal amplifying device 70, instead of the electric characteristic measuring device 52 of the sample measuring device 5 according to the first embodiment. The other structure is the same as that in the first embodiment.

The weak signal amplifying device 70 detects a current (signal) flowing through a wiring pattern 25a of the semiconductor sample 25 through each of the probes 45 (FIG. 7 shows only one probe), and amplifies the current to transmit the amplified current to the control device 42. For example, an amplifier is used as the weak signal amplifying device.

The other structure is the same as that in the first embodiment, and operations other than (5) Measurement of electric characteristics (normal temperature) and (7) Measurement of electric characteristics (the measurement of the temperature characteristics) are the same as those in the first embodiment.

Next, the details of the measurement of the electric characteristics of the semiconductor sample 25 will be described with reference to FIG. 8.

Figure 8:
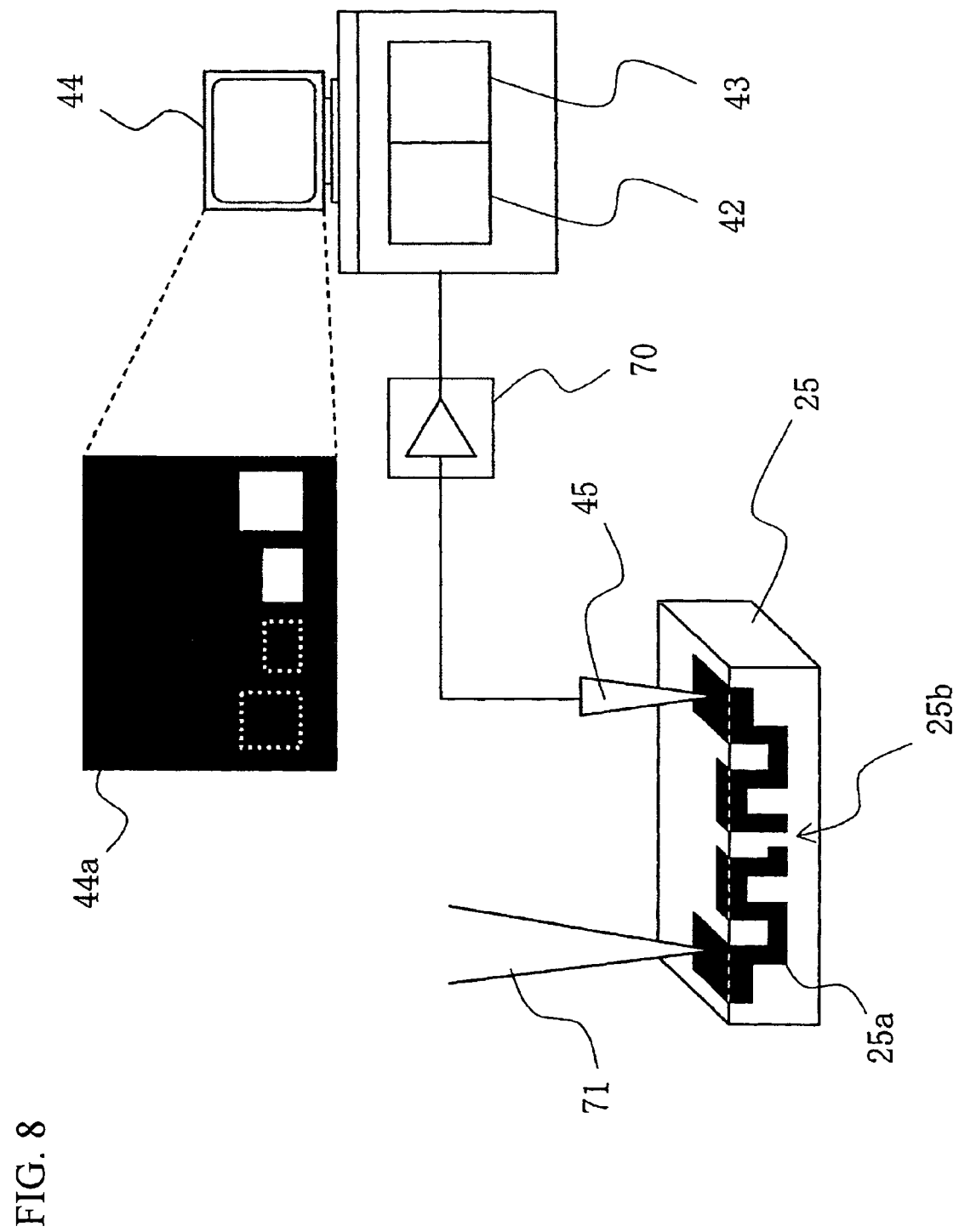
FIG. 8 is a diagram illustrating the details of the defect detection of a semiconductor sample.

FIG. 8 is a diagram schematically illustrating the cross section of the semiconductor sample 25 and the wiring pattern 25a.

First, the probe 45 is contacted with a desired point of the wiring pattern 25a of the semiconductor sample 25.

In this state, the semiconductor sample 25 is scanned with a primary electron beam 71 emitted from the SEM 3. A secondary electron (not shown) is generated from the surface of a portion of the semiconductor sample 25 irradiated with the primary electron beam 71, and at that time, a current flows through the wiring pattern 25a. When a wiring pattern 25 to which the primary electron beam 71 is radiated and the wiring pattern 25a contacted with the probe 45 are electrically connected to each other, the current is transmitted to the weak current amplifying device 70 through the probe 45, and then amplified. The amplified current is transmitted to the control device 42.

The control device 42 calculates the relationship between the radiation position of the primary electron beam 71 and the detected amount of current corresponding to the radiation position (electric characteristics), and controls the display device 44 to display the calculated result as an image. When a desired point of the semiconductor sample 25 is scanned with the primary electron beam 71, the scanned results, that is, electric characteristics are displayed as an image 44a on the display device 44. In the image 44a, a dark portion indicates a position where the amount of current detected by the probe 45 is less than a predetermined threshold value when the primary electron beam 71 is radiated, and a bright portion indicates a position where the amount of current detected by the probe 45 is more than a predetermined threshold value when the primary electron beam 71 is radiated. In addition, in the embodiment, the image 44a is binarized by the predetermined threshold value, but the present invention is not limited thereto. No threshold value may be set, and a target position of the image 44a may be displayed at a gradation level corresponding to (for example, in proportion to) the amount of current detected by the probe 45.

As shown in FIG. 8, when the wiring pattern 25a is cut at a point 25b and a portion irradiated with the primary electron beam 71 is disposed between the contact point of the probe 45 and the cut point 25b, a current is detected. However, when the portion irradiated with the primary electron beam 71 is opposite to the contact point of the probe with the cut point interposed therebetween, no current is detected even when the primary electron beam 71 is radiated. Therefore, it is possible to detect the cutting of the wiring pattern 25a in the vicinity of a position where dark and bright portions are switched on a continuous wiring pattern, by comparing the image 44a with, for example, the wiring layout pattern of the semiconductor sample 25.

In the embodiment having the structure, it is possible to obtain the same effects as those in the first embodiment.

In addition, it is possible to check the accurate position of a defective portion (cut portion) of the semiconductor sample 25 using an image. Therefore, it is possible to accurately examine the semiconductor sample by measuring the temperature characteristics after a defect is detected.

Description of Reference Numerals
1, 101: detecting unit
2: control unit
3: SEM
4: sample driving device
5, 105: sample measuring device
6: pump device
7: sample temperature adjusting device
8: cold trap device
9: sample coarse positioning mechanism
10: probe replacement mechanism
11: sample replacement mechanism
22: electron beam optical system
23: secondary electron detector
24: Z sensor
25: semiconductor sample
25a: wiring pattern
25b: cut point
26: sample holder
27: sample temperature adjusting portion
28: small stage
29: large stage
30: sample chamber
30a: waiting room
31: table
32, 53: turbo-molecular pump
33, 54: dry pump
34, 35: heat transfer line
36a, 36b: heat receiving portion 37, 40: heat transfer rod
38, 41: refrigerant container
39: trap portion
42: control device
43: power supply device
44: display device
44a: defect detection result image
45: probe
46: probe holder
47: probe unit
48: probe unit base
49: base stage
50, 51: field-through
52: electric characteristic measuring device
55: temperature sensor
56: insulating sheet
57: heater
60, 61, 62, 63: gate valve
70: weak signal amplifying device
71: primary electron beam
100, 110: apparatus for detecting defect

The invention claimed is:

1. An apparatus for detecting defect comprising:
   a sample stage that holds a sample;
   an electron optical system that observes the sample on the sample stage;
   a probe device that includes a probe contacted with the sample on the sample stage;
   an electric characteristic measuring device that measures electric characteristics of a probe contact point of the sample through the probe;
   a driving device that drives the sample stage;
   a heater that is provided in the sample stage and heats the sample stage;
   a first heat transfer portion that is connected to the sample stage;
   a sample chamber which is a vacuum chamber that accommodates the sample stage, the probe device, the driving device, the heater, and the first heat transfer portion therein and includes an observation/measurement position where the electron optical system observes the sample and the electric characteristic measuring device measures the electric characteristics of the sample, and a probe replacement position where the probe is replaced, in its inner space;
   a second heat transfer portion that is connected to the first heat transfer portion when the sample stage is disposed at the observation/measurement position and is separated from the first heat transfer portion to release the restriction of the sample stage when the sample stage is moved to the probe replacement position; and
   a refrigerant storage that is connected to the second heat transfer portion.

2. The apparatus for detecting defect according to claim 1, wherein the sample stage includes an intermediate layer between the heater and the sample stage, and the intermediate layer includes:
   a conductive portion that is connected to the heater; and
   an insulating portion that is connected to the conductive portion and the sample stage, and cuts a flow of a current between the conductive portion and the sample stage.

3. The apparatus for detecting defect according to claim 1, wherein the first heat transfer portion and the second heat transfer portion have a movable range that allows movement of the sample stage when the electric characteristics of the sample are measured, in a connection state.

4. The apparatus for detecting defect according to claim 1, wherein, when the second heat transfer portion is separated from the first heat transfer portion, the first heat transfer portion has heat capacity capable of maintaining the sample at a target temperature or less while the sample stage is moved from the observation/measurement position to the probe replacement position to replace the probe, and returns to the observation/measurement position.

5. The apparatus for detecting defect according to claim 4, wherein, when the target temperature of the sample is lower than a room temperature, the sample stage is heated and cooled at the same time.

6. The apparatus for detecting defect according to claim 4, wherein, when the target temperature of the sample is lower than a room temperature, the first heat transfer portion and the second heat transfer portion are connected to each other, and
when the target temperature of the sample is higher than the room temperature, the first heat transfer portion and the second heat transfer portion are separated from each other.

7. The apparatus for detecting defect according to claim 4, wherein, when the target temperature of the sample is equal to a room temperature and when the target temperature of the sample is lower than the room temperature, the first heat transfer portion and the second heat transfer portion are separated from each other, and
when the target temperature of the sample is higher than the room temperature, the first heat transfer portion and the second heat transfer portion are connected to each other.

8. The apparatus for detecting defect according to claim 1, further comprising:
   a cold trap device that includes a cold trap which is cooled to a temperature that is lower than the temperature of the sample, and adsorbs contaminants of the sample.

9. The apparatus for detecting defect according to claim 1, further comprising:
   a display device that displays an image on the basis of the current measured by the electric characteristic measuring device.

* * * * *